United States Patent
Guillet

(10) Patent No.: US 12,249,698 B2
(45) Date of Patent: Mar. 11, 2025

(54) METHOD AND DEVICE FOR MANAGING THE THERMAL BEHAVIOR OF A BATTERY

(71) Applicant: COMMISSARIAT A L'ENERGIE ATOMIQUE ET AUX ENERGIES ALTERNATIVES, Paris (FR)

(72) Inventor: Nicolas Guillet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 700 days.

(21) Appl. No.: 17/447,609

(22) Filed: Sep. 14, 2021

(65) Prior Publication Data

US 2022/0085431 A1 Mar. 17, 2022

(30) Foreign Application Priority Data

Sep. 15, 2020 (FR) ...................................... 20 09305

(51) Int. Cl.
| | |
|---|---|
| H01M 10/48 | (2006.01) |
| G01R 31/374 | (2019.01) |
| G01R 31/387 | (2019.01) |
| G01R 31/392 | (2019.01) |
| H01M 10/42 | (2006.01) |
| H01M 10/44 | (2006.01) |
| H01M 10/613 | (2014.01) |
| H01M 10/633 | (2014.01) |

(52) U.S. Cl.
CPC ........ *H01M 10/486* (2013.01); *G01R 31/374* (2019.01); *G01R 31/387* (2019.01); *G01R 31/392* (2019.01); *H01M 10/443* (2013.01); *H01M 10/613* (2015.04); *H01M 10/633* (2015.04); *H01M 2010/4271* (2013.01)

(58) Field of Classification Search
None
See application file for complete search history.

(56) References Cited

U.S. PATENT DOCUMENTS

| | | | |
|---|---|---|---|
| 2012/0188086 A1 | 7/2012 | Xie et al. | |
| 2019/0148952 A1 | 5/2019 | Remboski et al. | |
| 2019/0267826 A1* | 8/2019 | Akaishi | ............... H01M 10/441 |
| 2021/0210810 A1* | 7/2021 | Chuang | ..................... B60L 1/02 |

FOREIGN PATENT DOCUMENTS

CN 108062086 A 5/2018

OTHER PUBLICATIONS

French Preliminary Search Report issued May 18, 2021 in French Application 20 09305 filed on Sep. 15, 2020, 10 pages.

\* cited by examiner

*Primary Examiner* — Jonathan Crepeau
(74) *Attorney, Agent, or Firm* — Oblon, McClelland, Maier & Neustadt, L.L.P.

(57) ABSTRACT

A method for managing the thermal behavior of a battery includes employing a thermal model of the battery. The model is configured to estimate, at each point in time, a thermal power generated by the battery depending on a measured electrical power passing through the battery. The thermal model includes a charging law and a discharging law, each law being based on the state of charge of the battery and on its temperature and incorporating the time constant of the battery. The method also includes controlling the thermal power generated by the battery.

13 Claims, 7 Drawing Sheets

Fig. 3
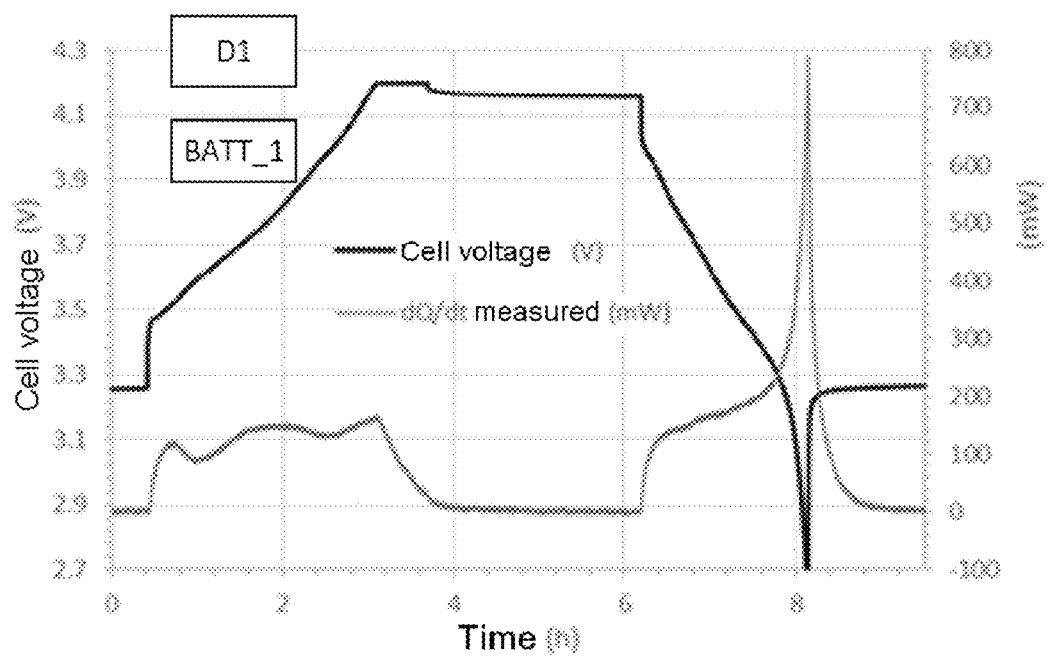
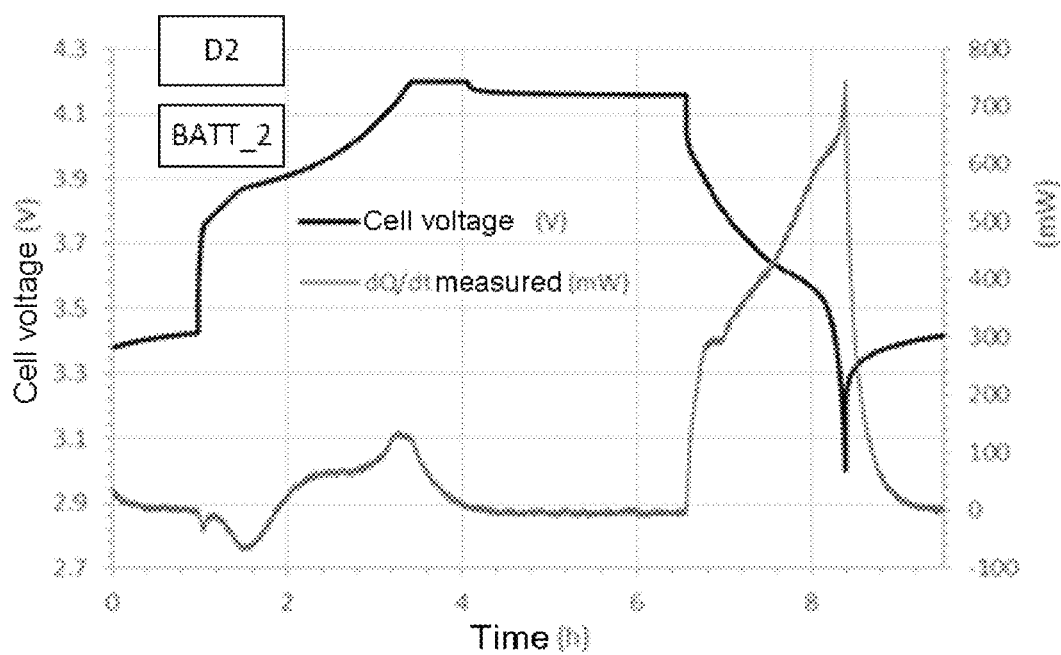

Fig. 5
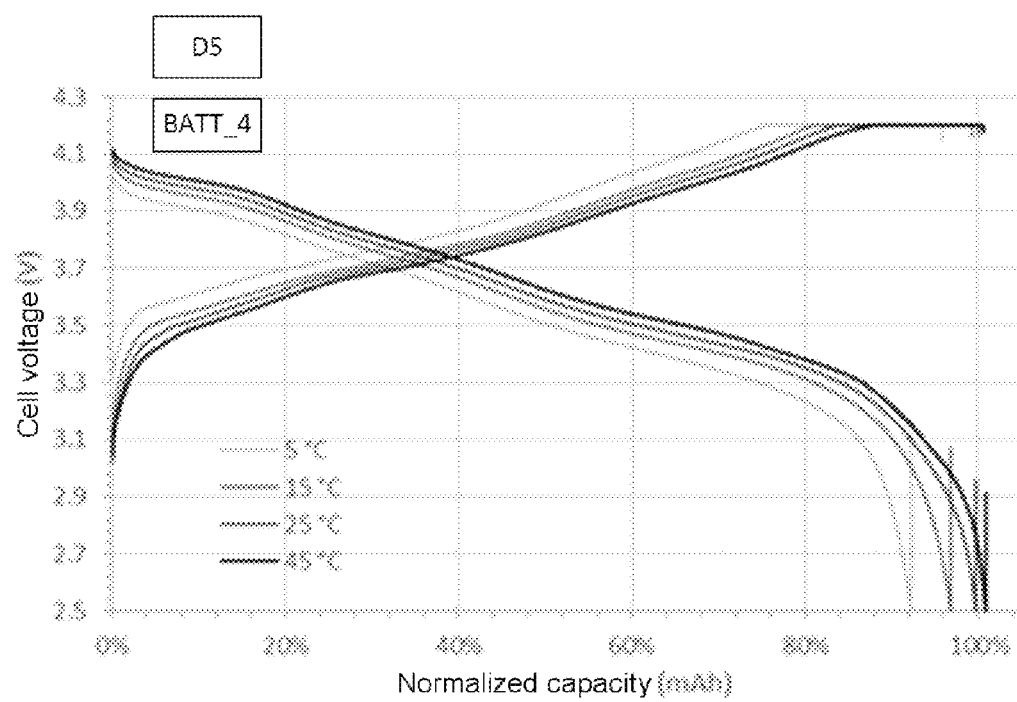
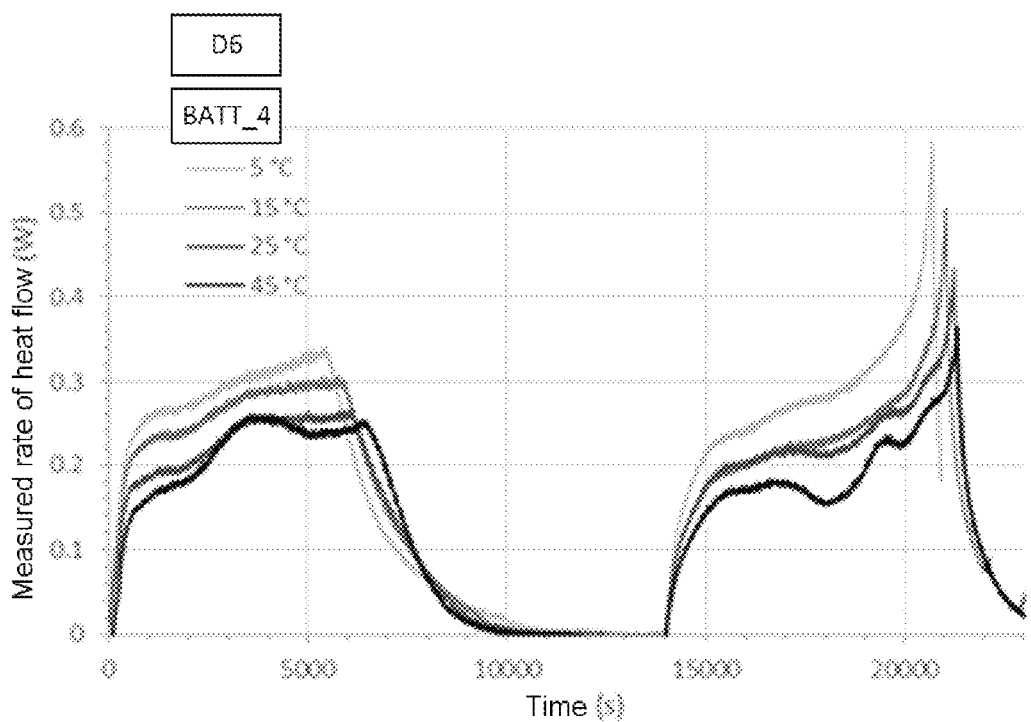

Fig. 7
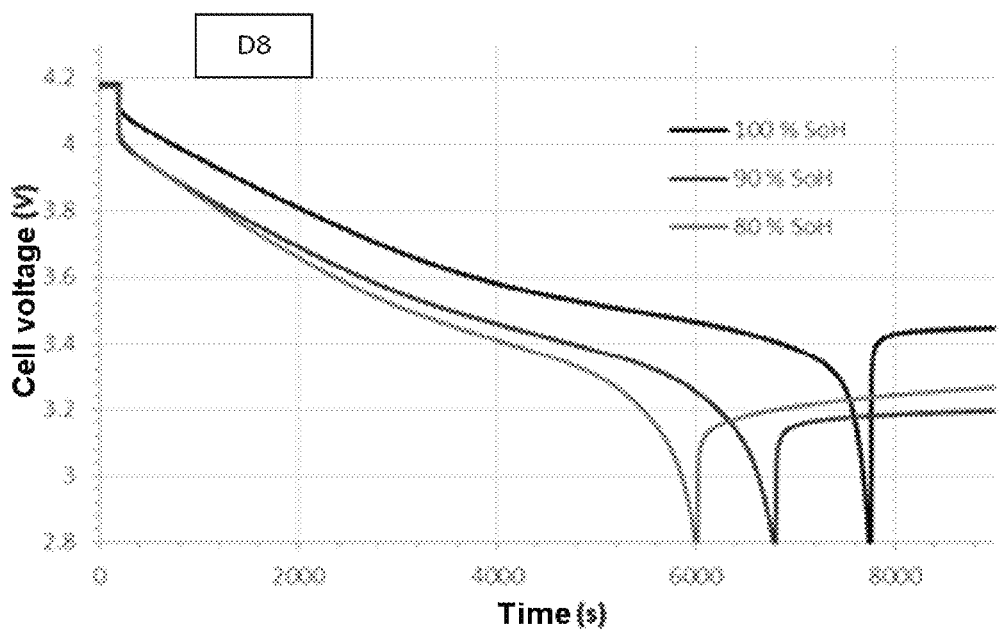
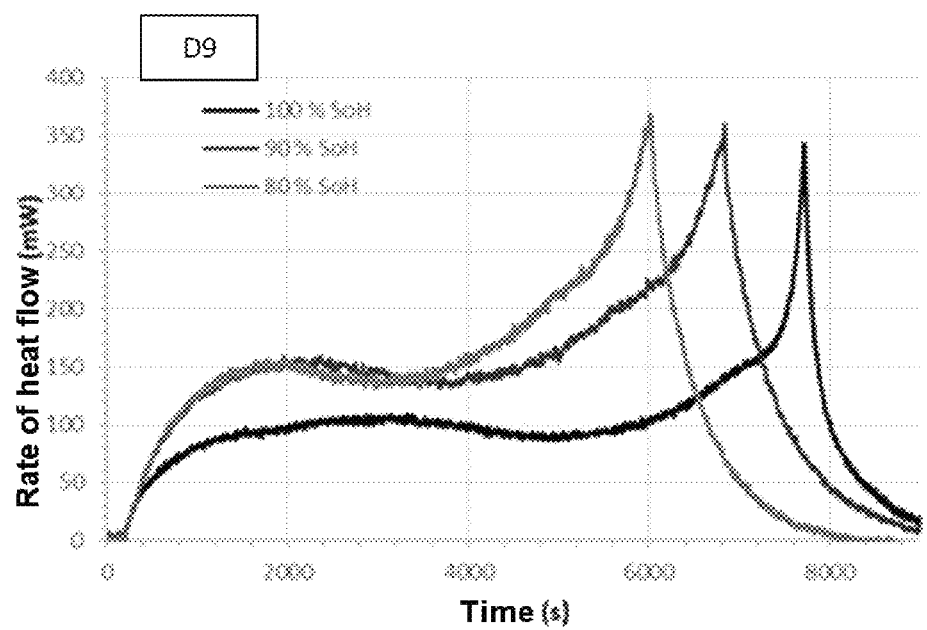

METHOD AND DEVICE FOR MANAGING THE THERMAL BEHAVIOR OF A BATTERY

TECHNICAL FIELD OF THE INVENTION

The present invention relates to a method and device for managing the thermal behavior of an electrical battery.

PRIOR ART

During its operation, the temperature of a battery may vary greatly, depending on its intrinsic characteristics, on the environment in which it is operating, on the electrical power passing through it (during charging or discharging), or on the temperature-regulating equipment, if any, that is associated with it (fan, cooling, heating, etc.).

It is well known that operation at extreme temperatures (low temperatures <0° C. or high temperatures >45° C.) may have substantial consequences on the lifetime of most types of battery.

Furthermore, many applications subject batteries to very tight constraints, such as, for example:
  the fastest possible recharge,
  many charging/discharging cycles,
  high powers to deliver or to accept.

The consequence this has on the materials from which the battery is made may be manifold but one thereof is generally a substantial variation in the internal temperature of the battery. Although this variation in temperature is very rapid, it may in addition be non-uniform within the battery and lead to high local stresses, both thermal and mechanical, and may accelerate certain causes of degradation of the materials and performance of the battery.

It is moreover not easy to precisely determine the internal temperature of a battery. The time constant between the generation of heat by the components of the battery and its diffusion to the external surface of the battery may be very large, up to several minutes, even in a battery of small size. Furthermore, the surface temperature of a battery is often very far from being uniform.

Techniques for analyzing the thermal properties of batteries have been employed to evaluate their state of health with measurements of temperature or of rate of heat flow exchanged with the environment.

Known techniques do not make it possible to ensure that a battery, during charging or discharging, is not subjected to excessively high thermal stresses. Current solutions allowing the temperature of a battery to be monitored are often ineffective because the actions taken with a view to regulation or ensuring safety are often taken too late, notably because of the time constant of the battery.

Solutions for managing the thermal behavior of a battery are described in documents US2012/188086A1, US2019/148952A1 and CN108062086A.

The aim of the invention is to provide a method that allows the thermal behavior of a battery to be effectively monitored with a view to potentially taking regulating/warning actions that are appropriate to the actual thermal situation of the battery.

DISCLOSURE OF THE INVENTION

This aim is achieved via a method for managing the thermal behavior of a battery, which consists in:
  determining a time constant of the battery, said time constant corresponding to the time interval existing between the moment at which thermal energy is given off by the battery and the moment at which a corresponding rate of heat flow is measured at the surface of the battery,
  employing a thermal model of the battery, which model is configured to estimate, at each point in time, a thermal power generated by the battery depending on a measured electrical power passing through the battery, said thermal model comprising a charging law and a discharging law, each law being based on the state of charge of the battery and on its temperature and incorporating the time constant of the battery,
  controlling the thermal power generated by the battery.

According to one particularity, the method also comprises steps of:
  estimating the thermal power generated at each point in time by the battery depending on the electrical power delivered at each point in time by the battery during charging thereof or generated at each point in time by the battery during discharging thereof, said thermal power being determined using said thermal model,
  comparing the thermal power estimated at each point in time, or a variation in the estimated thermal power over time, during charging or during discharging, with a limiting value,
  controlling the electrical power delivered to the battery during charging or generated by the battery during discharging in order to keep said estimated thermal power below said limiting value.

According to another particularity, the method comprises steps of:
  determining at each point in time a limiting value of the electrical power that is acceptable to the battery on the basis of a limiting value of the thermal power that is acceptable, the latter limiting value being stored in memory beforehand and injected into said thermal model,
  controlling the electrical power passing through the battery during charging or during discharging in order to keep this electrical power below said limiting value.

According to another particularity, the thermal power is estimated, at each point in time, also taking into account the state of health (SoH) of the battery.

According to another particularity, the method comprises a prior step of determining the time constant of the battery, said time constant corresponding to the time interval existing between the moment at which thermal energy is given off by the battery and the moment at which a corresponding rate of heat flow is measured at the surface of the battery.

According to another particularity, the method comprises prior steps of establishing said thermal model of the battery.

According to another particularity, the method comprises a step of verifying the thermal model of the battery, by comparing the thermal power measured at a plurality of times during charging or during discharging with the thermal power estimated at said times using the thermal model of the battery, not corrected for the time constant of the battery.

The invention also relates to a device for managing the thermal behavior of a battery, the device comprising:
  a module for determining a time constant of the battery, said time constant corresponding to the time interval existing between the moment at which thermal energy is given off by the battery and the moment at which a corresponding rate of heat flow is measured at the surface of the battery,
  a module for executing a thermal model of the battery, which model is configured to estimate, at each point in time, a thermal power generated by the battery depending on a measured electrical power passing through the battery, said thermal model comprising a charging law and a discharging law, each law being based on the state of charge of the battery and on its temperature and incorporating the time constant of the battery, a module for controlling the thermal power generated by the battery.

According to one particular embodiment, the device comprises:

a module for estimating the thermal power generated at each point in time by the battery depending on the electrical power delivered at each point in time by the battery during charging thereof or generated at each point in time by the battery during discharging thereof, said thermal power being determined using said thermal model, a module for comparing the thermal power estimated at each point in time, or a variation in the estimated thermal power over time, during charging or during discharging, with a limiting value, a module for controlling the electrical power delivered to the battery during charging or generated by the battery during discharging in order to keep said estimated thermal power below said limiting value.

According to another particular embodiment, the device comprises:

a module for determining at each point in time a limiting value of the electrical power that is acceptable to the battery on the basis of a limiting value of the thermal power that is acceptable, the latter limiting value being stored in memory beforehand and injected into said thermal model, a module for controlling the electrical power passing through the battery during charging or during discharging in order to keep this electrical power below said limiting value.

According to another particular embodiment, the thermal power is estimated, at each point in time, also taking into account the state of health of the battery.

According to another particular embodiment, the device comprises a module for determining the time constant of the battery, said time constant corresponding to the time interval existing between the moment at which thermal energy is given off by the battery and the moment at which a corresponding rate of heat flow is measured at the surface of the battery.

According to another particular embodiment, the device comprises a module for establishing said thermal model of the battery.

According to another particular embodiment, the device comprises a module for verifying the thermal model of the battery, this module being configured to compare the thermal power measured at a plurality of times during charging or during discharging with the thermal power estimated at said times using the thermal model of the battery, not corrected for the time constant of the battery.

BRIEF DESCRIPTION OF THE FIGURES

Other features and advantages will become apparent from the following detailed description, which is given with reference to the appended figures listed below:

FIG. 3 shows two graphs illustrating the influence of the characteristics of batteries on their thermal behavior;

FIG. 5 shows two graphs illustrating the influence of ambient temperature on the thermal behavior of the battery;

FIG. 7 shows two graphs illustrating the influence of the state of health of a battery on the thermal behavior of the battery;

DETAILED DESCRIPTION OF AT LEAST ONE EMBODIMENT

The invention is applicable to the thermal management of a battery BATT, for example a metal-ion battery, and advantageously a lithium-ion battery. It may for example be a question of a battery of cylindrical format of 18650 or 21700 type.

In the present patent application, a battery BATT may consist of one or more electrochemical cells.

The proposed invention aims to limit the appearance of temperature gradients in a battery during its operation, and thus to slow the degradation of the materials from which the battery is made in order to maintain its performance for as long as possible.

Figure 1:
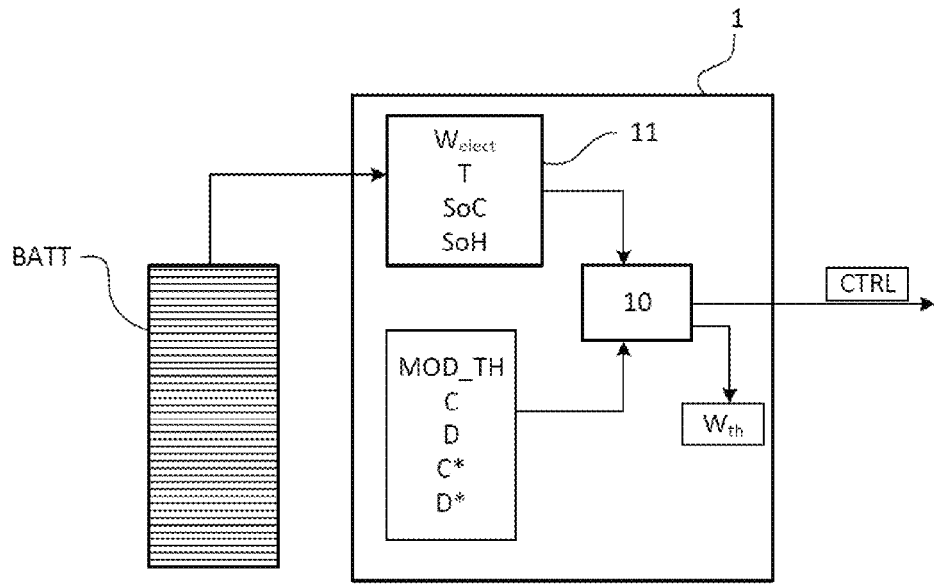
FIG. 1 schematically shows the device for managing the thermal behavior of a battery, according to the invention.

The invention, which is presented in FIG. 1, consists of a method for managing the thermal behavior of the electrical battery and of a managing device 1 configured to implement this method.

The device 1 for managing the thermal behavior of the battery mainly comprises means 11 for measuring and determining various parameters of the battery and processing and control means 10 configured to process said parameters. The managing device may be integrated into a battery management system (BMS).

The method makes it possible to estimate, at each point in time, the thermal power $W_{th}$ exchanged by the battery BATT with its environment, whatever its operating regime, during charging or discharging.

The thermal power $W_{th}$ thus estimated may be used by the managing device 1 to:

limit the increase in the overall temperature of the battery by acting for example on a piece of equipment for regulating temperature: fan, cooling, heating, etc.

decrease the appearance of temperature gradients in the battery by temporarily limiting the electrical power permitted to the battery (during charging or discharging).

detect potential malfunctions of the battery and apprising, if necessary, the user or a monitoring system that guarantees the safety of the battery.

Various effects and parameters influence the thermal behavior of the battery, notably:

the intrinsic characteristics of the battery BATT (composition and internal structure, format, etc.);

its operating regime (charging or discharging) and the type of operation during charging or discharging;

the thermal environment of the battery BATT, i.e. ambient temperature;

the time constant of the battery;

the state of health (SoH) of the battery.

These effects and parameters are detailed below, with reference to FIGS. 3 to 7.

The Intrinsic Characteristics of the Battery

To illustrate this effect, two Li-ion batteries BATT_1 and BATT_2 of different references but of identical formats (18650, cylindrical) and similar performance will be considered.

FIG. 3 shows examples of rates of heat flow measured during a (CC-CV) charging/discharging cycle in a C/3 charging regime and C/2 discharging regime at 25° C. The two Li-ion batteries are of different references but of identical formats (18650, cylindrical) and similar performance. The graph D1 has thus been given the reference BATT_1 and the graph D2 the reference BATT_2.

In FIG. 3, it may thus be observed that during charging of the battery BATT_1 the measured rate of heat flow does not remain constant. It increases sharply at the start of charging then passes through a succession of minima and maxima before reaching a maximum value at the end of the constant-current charging. In the constant-voltage phase, the current decreases with time and the heat generated by Joule heating does the same. During discharging, the heat given off rapidly increases at the start of discharging and then continuously increases to reach a very high value (800 mW of thermal energy exchanged with the exterior for about 4 W of delivered electrical power).

As regards the battery BATT_2, a very different behavior may be observed. At the start of charging, the measured rate of heat flow is negative. This means that an endothermic chemical reaction is absorbing more thermal energy than Joule heating produces. This trend inverts in the second part of the charging, with a maximum amount of heat being exchanged at the end of the constant-current charging phase. During discharging, this battery generates, throughout the discharge, much more heat that the battery BATT_1, even though the thermal power is reached at the end of discharging.

For each battery reference, a specific thermal signature must therefore be taken into account. This thermal signature depends on the chemical reactions that occur within the battery (reversible heat), on the internal structure of the battery and in particular on electrical resistance.

Operating Regime of the Battery

The charging and discharging regime of the battery, and more particularly the electrical power passing through the battery, has a notable influence on the amount of heat exchanged by the battery with its environment. The higher the electrical power, the higher the amount of heat generated by Joule heating.

Figure 4:
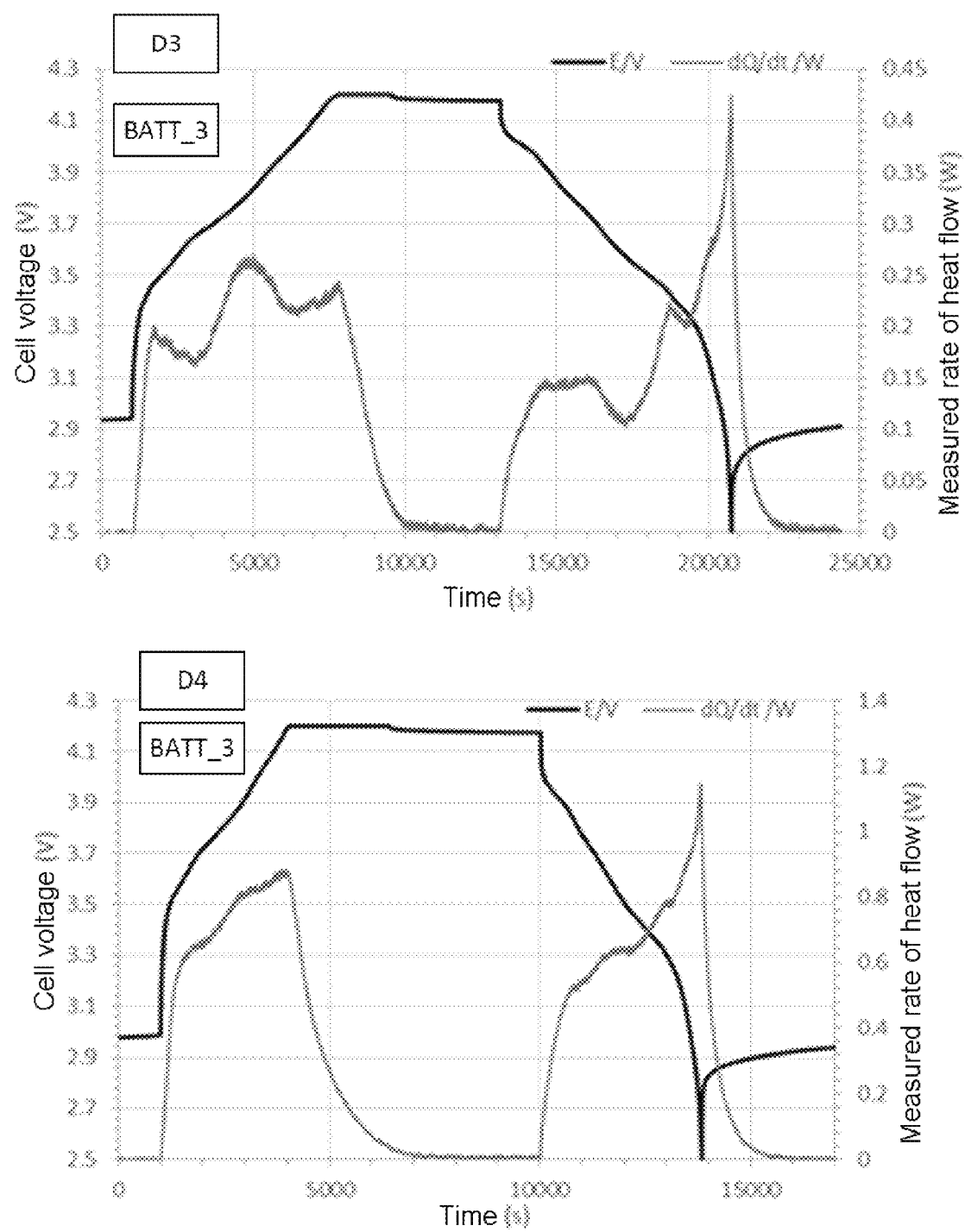
FIG. 4 shows two graphs illustrating the influence of the operating regime of a battery on its thermal behavior.

FIG. 4 shows examples of behavior of an Li-ion cell of reference BATT_3 during (CC-CV) charging/discharging cycles in various charging and discharging regimes. In the graph D3, the curves of variation in the cell voltage and the measurements of rate of heat flow during a charging/discharging cycle in a C/2 regime. In the graph D4, the same is shown for a 1C regime.

The two curves of FIG. 4 show the variation in the voltage of a cell of a battery and the rate of heat flow exchanged by the battery with the environment as a function of time.

It will be recalled that: the letter C is used to define the charging/discharging regime of a battery and is equal to the capacity of a battery divided by 1 hour. For a 1600 mAh battery, the value C is 1.6 A. For the same battery, C/5 corresponds to 320 mA and C/10 to 160 mA. C is therefore relative to the capacity of the battery: the discharging or charging regime C for batteries of various capacities is therefore different.

From the graphs D3 and D4, it may thus be seen that the thermal signatures of a given Li-ion battery cell appear very different depending on the charging/discharging regime employed.

Ambient Temperature

The temperature of the environment may also have a notable influence on the amount of thermal energy exchanged by the battery with the environment during operation. As temperature increases, the electrical resistance of the liquid electrolyte decreases and the share of losses taking the form of irreversible heat (Joule heating) decreases. The thermal signature of the battery is dependent on the temperature of the environment.

FIG. 5 shows examples of behavior of an Li-ion cell of reference BATT_4 during (CC-CV) charging/discharging cycles in a C/2 charging regime and C/2 discharging regime at various temperatures. In the graph D5, curves of the variation in cell voltage as a function of the normalized capacity at 25° C. may be seen. In the graph D6, the rates of heat flow measured over time during charging-discharging cycles at various temperatures may be seen.

Time Constant of the Battery

There is a certain delay between the time at which heat is generated within the materials of the battery and the time at which a rate of heat flow is measured on the surface of the battery. An example is given in FIG. 6, which shows the variation in the rate of heat flow measured for a battery after a constant-current or constant-power discharge. When the discharge of the battery is stopped, i.e. when heat is no longer being generated, the measured rate of heat flow slowly decreases with time.

Figure 6:
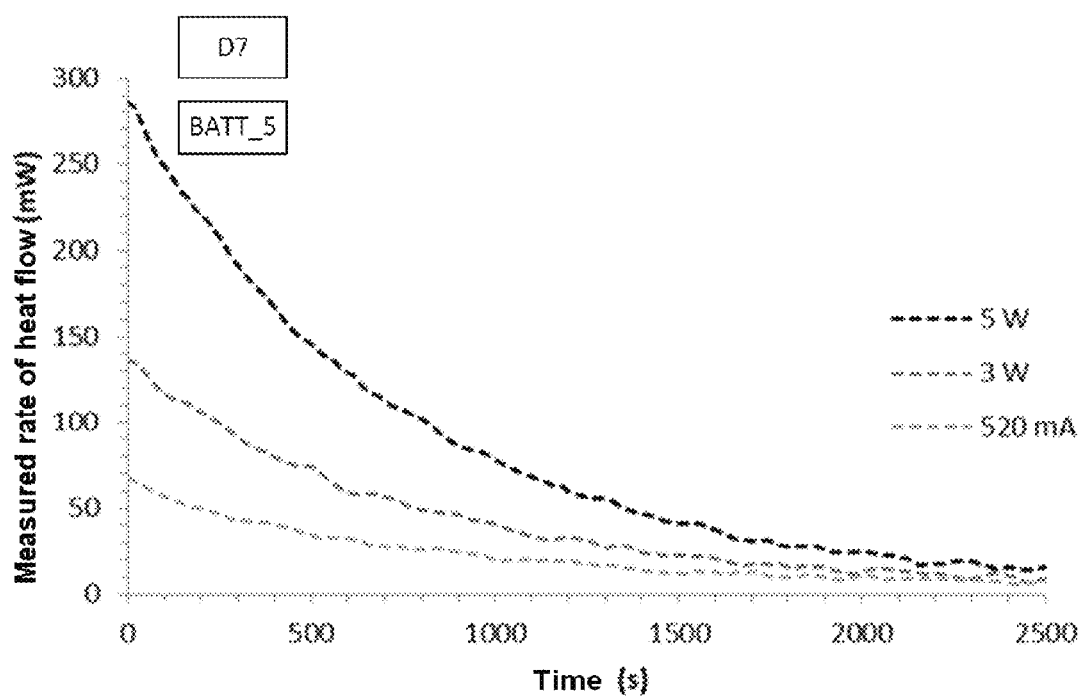
FIG. 6 shows two graphs illustrating the influence of the time constant on the thermal behavior of the battery.

FIG. 6 shows the variation in the rate of heat flow generated by a battery cell after a constant-current (520 mA) or constant-power (3 and 5 W) discharge.

In FIG. 6, the time constant calculated under the conditions of this trial for a battery cell BATT_5 of 18650 format (cylindrical format of 18 mm diameter and 65 mm length) is of the order of 830 s, whatever the electrical power of the discharge. This time interval may vary greatly depending on the heat capacity of the battery, on its weight, on its shape, on the devices employed to promote transfer of heat to the environment and on the equipment employed, if any, to regulate its temperature.

State of Health of the Battery

During aging of a battery, the rate of heat flow generated during discharging may vary greatly because of a possible increase in the internal resistance (increase in irreversible losses due to Joule heating) of the battery, because of a loss of capacity or because of a variation in the thermodynamic parameters of the electrochemical reactions (in particular of enthalpic and entropic terms). The influence of aging of battery cells on the transfer of heat to the environment may be seen in FIG. 7.

In FIG. 7, the graph D8 shows a comparison of curves of discharge, at a current corresponding to a C/2 regime, of identical cells in three different states of health (100%, 90%, 80%). The graph D9 shows a comparison of curves of rate of heat flow dissipated for the same cells in three different states of health.

It will be understood from the above that, for each battery reference, a particular thermal signature must therefore be considered by the temperature-managing device. The variation in the heat generated depends on the state of charge of the battery and on the electrical current passing through it, on the heat capacity of the battery and on the quality of the transfer of heat to its environment.

The object of this invention is to propose a method allowing, at each point in time, an estimate to be computed of the thermal power (referenced $W_{th}$) that will be generated within the materials from which the battery BATT is made, depending on the electrical power allowed to pass through the battery ($W_{elect}$ during charging or discharging), and on the basis of the characteristics of the battery and of its environment (materials from which the battery is made, ambient temperature, state of health, time constant, etc.).

On the basis of the estimate of the thermal power $W_{th}$ as a function of the electrical power $W_{elect}$, is notably possible to establish a particular control mechanism CTRL (see FIG. 1) to adapt the strategy of use of the battery.

Figure 2:
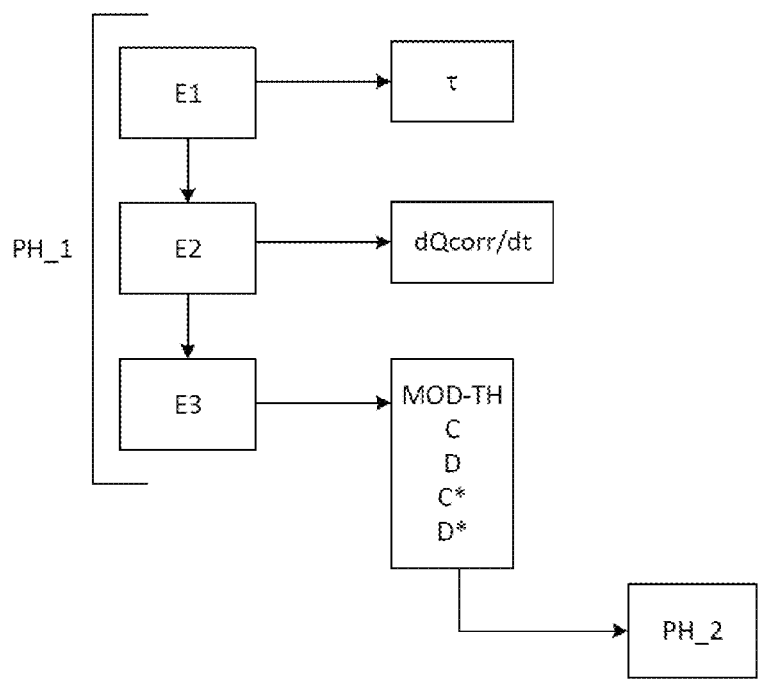
FIG. 2 illustrates the various steps of the method for managing the thermal behavior of a battery, according to the invention.

With reference to FIG. 2, the method for managing the thermal behavior of the battery may be divided into two main phases, a first phase PH_1 called the learning or calibrating phase, which allows a thermal model MOD_TH of the overall system incorporating the battery to be generated, and a second phase, called the monitoring phase, during which the thermal model MOD_TH that was generated is employed to monitor the thermal behavior of the battery BATT.

The calibrating phase PH_1 comprises a plurality of steps. These calibrating steps are carried out on the overall system, i.e. including the battery in its environment, and potentially including its temperature-regulating equipment (fan, cooler, heater, etc.). The calibration may be carried out on a single system and the laws that result therefrom applied to all identical systems.

Step E1: Determining the time constant T of the battery in its operating environment. The time constant T corresponds to a time interval that may vary greatly depending on the heat capacity of the battery, on its shape, on the devices employed to promote transfer of heat to the environment and on the associated temperature-regulating equipment.

Figure 8:
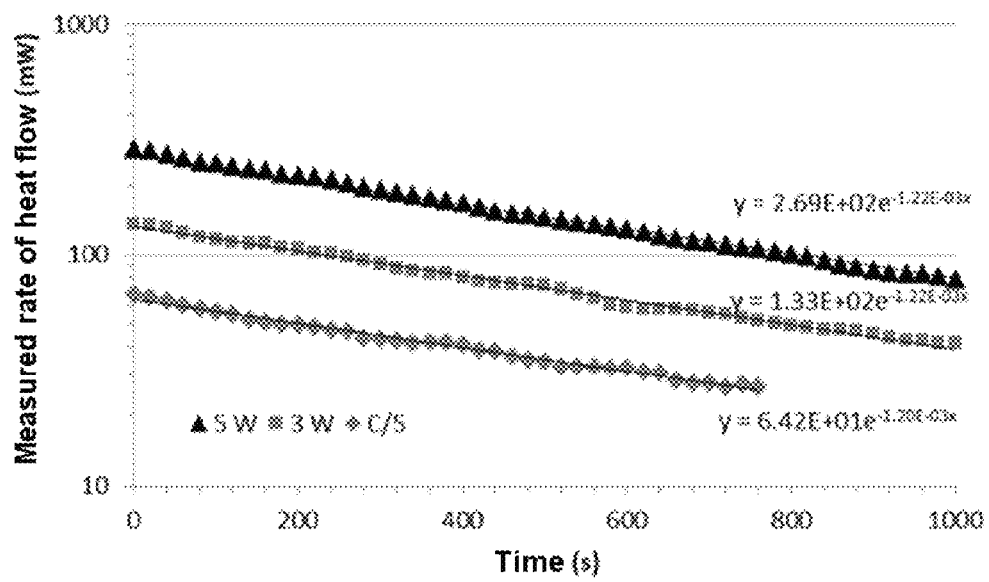
FIG. 8 shows the variation in the logarithm of the rate of heat flow from a battery as a function of time.

To compute this time constant, the managing device measures the rate of heat flow generated by the battery BATT. FIG. 8 thus shows the variation in the logarithm of the rate of heat flow as a function of time. Considering the variation in the measured rate of heat flow $$\frac{dQmes}{dt}$$

to decrease exponentially, it is possible to compute a time constant τ using the following equation:

$$\frac{dQmes}{dt} = A\exp\left(\frac{-t}{\tau}\right)$$

with:
A a pre-exponential parameter that varies proportionally to the electrical power passing through the battery (in this case, $A=74\times W_{elec}-100$); and
t corresponds to time.

In the case of FIG. 8, the time constant computed for the three electrical powers is 825 s+/−7 s.

It is possible to carry out these measurements at various temperatures over the entire working range of the battery and to obtain variation-describing laws A(T) and τ(T) that will be used for the management of the battery.

Step E2: This is a step in which the rates of heat flow generated by the system including the battery are measured at a plurality of successive times, under a plurality of different operating conditions (state of charge of the battery, temperature, electrical power, state of health of the battery optionally). This step consists in establishing a relationship that allows the rate of heat flow generated to be determined on the basis of a measurement of rate of heat flow, of skin temperature or of another parameter relating to the apparent temperature of the battery (temperature of a coolant, speed of a fan automatically controlled depending on temperature, etc.).

To do this, it is necessary to solve a differential equation (Tian-Calvet equation below) to determine the value of the parameters α and β allowing a corrected rate of heat flow (black dashed line in FIG. 9) to be obtained, on the basis of the measurement of rate of heat flow (for example, or another temperature indicator) and of the time constant that was computed in step E1 (the time constant of the system is considered to be dependent on the system itself and not to vary over time).

The Tian-Calvet equation, which has been reproduced below, therefore expresses a correction to measured rates of heat flow, based on a law describing the variation in the rate of heat flow as a function of time:

$$dQcorr/dt = a(d(dQmes/dt))/dt) + \beta(dQmes/dt)$$

with:
dQcorr/dt, the rate of heat flow corrected for the time constant of the system, and which is supposed to reflect the thermal power generated at each point in time by the battery;
the parameter α proportional to the heat capacity of the system and corresponding to the amount of heat to be delivered to observe a variation in the rate of heat flow; and
the parameter β relating to the leakage of heat to the environment via thermal conductivity.

Figure 9:
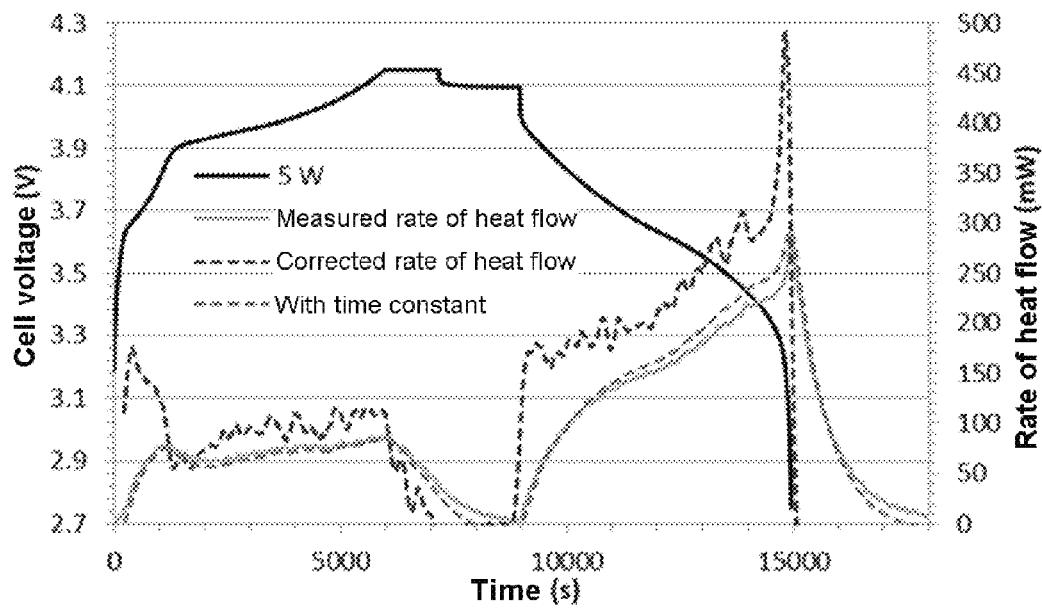
FIG. 9 illustrates the difference between the rate of heat flow measured for a battery of 18650 format and the rate of heat flow corrected using the time constant of the system.

FIG. 9 shows an example of comparison between the rate of heat flow measured for a cell of 18650 format and the rate of heat flow corrected using the time constant of the system.

On the basis of these two parameters α, β, which are specific to the studied system, and which may be defined for a complete batch of batteries of identical references assembled identically, it is thus possible to compute the corrected rate of heat flow at each point in time. The correction for the time constant of the rate of heat flow is indispensable to the estimation of the thermal power generated at each point in time. It is all the more advantageous if the profile of electrical power of the battery contains substantial variations.

Step E3: Establishing the thermal model of the battery.

On the basis of the data gathered in the preceding steps, it is possible to establish a thermal model of the battery, which will allow, at each point in time, the thermal power that will be generated to be estimated for extended values of electrical power during charging and discharging of the battery.

The thermal model MOD_TH takes into account all of the operating parameters of the battery (charging/discharging, T, SoC, SoH) and their range of variation, thus allowing the generated thermal power output by the system in operation to be estimated.

In other words, in the above step, step E2, it is possible to measure rates of heat flow generated by the system, under various operating conditions. The Tian and Calvet equation describing the variation in the rate of heat flow allows an estimate of the rates of heat flow generated at each point in time under each of the operating conditions in question to be computed.

The following step therefore consists in developing a model that allows a relationship between the generated rates of heat flow (thermal power $W_{th}$) and the electrical power ($W_{elect}$) passing through the battery to be established for all of the operating parameters, notably its estimated state of charge SoC (as estimated by the managing device), its temperature T (measured) and optionally its state of health SoH.

Thus, two laws that govern the operation of the system in which the battery is employed are obtained:

During charging: $W_{th}=W_{elect} \times C(SoC,T)$.

During discharging: $W_{th}=W_{elect} \times D(SoC,T)$.

with:

$W_{th}$ the thermal power estimated for the electrical power $W_{elect}$ on the basis of a law C corresponding to the variation in the ratio Wth/Welect during charging of the battery, and which depends on state of charge (SoC) and temperature (T); D the equivalent law to C, established for discharging of the battery.

These laws may also be complexified by advantageously integrating the variation in the state of health (SoH) of the battery over time.

During charging: $W_{th}=W_{elect} \times C(SoC,T,SoH)$.

During discharging: $W_{th}=W_{elect} \times D(SoC,T,SoH)$.

This calibrating phase may be carried out to obtain the laws C and D, which allow the thermal power generated within the materials of the battery to be estimated depending on the electrical power allowed to pass through the latter (during charging, and during discharging). It is then possible to anticipate abrupt variations in the amount of heat generated during the operation of the battery.

The established laws C and D may feed a database and will possibly be used on a batch of identical or similar batteries. It is also possible to carry out an occasional or periodic calibration in order to verify that the previously defined laws C and D are still valid.

Now, it will be noted that, starting with the laws C and D, it is possible to take into account the time constant of the system and to define laws C* and D* that will allow, at any point in time, the rate of heat flow (or the thermal parameter in question: skin temperature, coolant temperature, fan speed, etc.) to be estimated and compared with the value measured for the system. In FIG. 9, the values computed using the laws C* and D* are shown by the gray dashed curve. They are to be compared with the measured values (solid gray curve). A substantial deviation of the laws would be a sign of aging of the battery or of a malfunction within the battery.

Implementation of the calibrating phase PH_1 requires the rate of heat flow exchanged by the battery with its environment to be measured with a view to correlating it with the electrical power passing through the battery. To do this, it is possible to use one or more sensors of rate of heat flow at the surface of the battery, these preferably being placed on the surfaces of heat exchange of the battery with its environment that are of largest area (lateral faces in the case of a prismatic battery, heightwise surfaces for cylindrical formats) It is possible to place temperature probes, or any other device for measuring temperature, on the surface of the batteries. The principle is to be able to measure or compute the thermal power exchanged by the battery under various operating conditions (temperature, operating regime).

The second phase PH_2 of the method of the invention is a phase in which the thermal behavior of the battery is said to be monitored. It consists in using the thermal model MOD_TH generated in the calibrating phase to establish a particular control mechanism CTRL and to monitor the thermal behavior of the battery BATT.

On the basis of the thermal model MOD_TH and of the corresponding laws, the managing device may thus compute, at each moment in time, the thermal power equivalent to the electrical power $W_{elect}$ during charging or discharging of the battery.

The determined thermal power $W_{th}$ may be processed and the control mechanism CTRL applied in many ways.

The device 1 for managing the battery may update, at each moment in time, limiting values of the electrical power of the battery in operation, during charging and discharging. The limiting value $W_{th\_max}$ of thermal power acceptable to a battery, during charging or discharging, does not change. It may be set by the manufacturer or by the user. In contrast, depending on the state of the battery and on its operating conditions, the electrical power passing through the battery, and through which the limiting value of thermal power is reached, will vary over time. The device may thus compute, at each point in time, an acceptable range of electrical power during charging and discharging [$W_{elect\_max\_d}$–$W_{elect\_max\_c}$]. The bounds ($W_{elect\_max\_d}$ and $W_{elect\_max\_c}$) may be defined on the basis of:

the maximum thermal power chosen by the manufacturer or the user: $W_{th\_max}$;

the acceptable variation in thermal power per unit time, chosen by the manufacturer or the user: $dW_{th}/dt\_max$.

The device must then ensure that the electrical power passing through the battery remains within the computed limits, this allowing the safety of operation of the battery to be guaranteed.

As a variant, the managing device 1 may convert, at each point in time, the electrical power $W_{elect}$ passing through the battery BATT into a thermal power $W_{th}$, using the thermal model MOD_TH of the battery BATT, and compare the thermal power $W_{th}$ thus computed with the acceptable limiting value $W_{th\_max}$ (set by the manufacturer or by the user) or its acceptable variation $dW_{th}/dt\_max$.

According to one particularity of the invention, the managing device 1 may be able to verify that the thermal model MOD_TH of the battery BATT remains valid over time and that the initially established laws allow the thermal power $W_{th}$ generated by the materials of the battery during operation to be estimated, with an acceptable error.

To verify the laws of the thermal model MOD_TH, the device 1 must consider the previously defined laws, not corrected for the time constant T of the battery. The device 1 then employs the laws referenced C*(SoC, T, SoH) and D*(SoC, T, SoH) to verify that the measured thermal power and the estimated thermal power are satisfactorily consistent. The device compares the measured exchanged values of thermal power (or associated quantities: local temperature, temperature of the cooling circuit, etc.) to the values estimated by the laws of the model, not corrected for the time constant.

It is possible to use one or more items of information relative to the heat exchanged by the battery BATT with its battery temperature environment. This may be information generated by sensors of rate of heat flow placed on the surface of the battery, temperature probes or other devices for measuring local temperature, secondary information related to temperature-regulating equipment such as the speed of a fan, the temperature of the coolant, etc.

Based on the verification of the thermal model MOD_TH, the managing device 1 may thus track the state of health SoH of the battery. Initially, the variation should be low or even almost zero. If the variation accelerates, this will be a sign of the acceleration of effects degrading the materials.

The managing device 1 may also verify whether the aging of the battery BBATT is as expected by the defined model MOD_TH. The detection of a deviation may be attributed to an unexpected malfunction. In this case, it is possible to inform the user thereof, so that he may plan a check-up or schedule maintenance.

Non-limitingly, during the verification, the validity of the laws of the thermal model MOD_TH may be evaluated using conventional statistical tools. By way of example, it is possible to use the standard deviation a of the differences between the measured and computed values over the last N−1 measurements (N>1). If the difference computed for measurement N is comprised in an interval of values of 2a (which statistically contains more than 95% of the difference values computed over the last N−1 measurements), the system is judged to be operating normally. In contrast, if the difference computed for measurement N is outside of an interval of values of 4σ (which statistically contains more than 99.99% of the difference values computed over the last N−1 measurements), the system may be considered, between measurement N−1 and measurement N, to have undergone a notable change and to no longer be satisfactorily represented by the proposed model and its laws.

The invention thus has many advantages, among which:
real-time thermal management of batteries, notably taking into account their time constants;
a solution that allows the use of batteries to be made safe;
a solution that adapts over time, via regular verification of the laws that govern the thermal behavior of the battery.

The invention claimed is:

1. A method for managing thermal behavior of a battery, comprising:
   determining a time constant of the battery, the time constant corresponding to a time interval existing between a moment at which thermal energy is given off by the battery and a moment at which a corresponding rate of heat flow is measured at a surface of the battery,
   measuring electrical power passing through the battery;
   employing a thermal model of the battery, wherein the model is configured to estimate, at each point in time, a thermal power generated by the battery depending on the measured electrical power passing through the battery, the thermal model comprising a charging law and a discharging law, each law being based on a state of charge of the battery and on a temperature of the battery and incorporating the time constant ($\tau$) of the battery, and
   controlling the thermal power generated by the battery comprising determining the thermal power using the model and controlling the electrical power passing through the battery based upon the determined thermal power.

2. The method according to claim 1, comprising:
   estimating the thermal power generated at each point in time by the battery depending on the electrical power delivered at each point in time by the battery during charging thereof or generated at each point in time by the battery during discharging thereof, the thermal power being determined using the thermal model,
   comparing the thermal power estimated at each point in time, or a variation in the estimated thermal power over time, during charging or during discharging, with a limiting value, and
   controlling the electrical power delivered to the battery during charging or generated by the battery during discharging in order to keep the estimated thermal power below the limiting value.

3. The method according to claim 1, comprising:
   determining at each point in time a limiting value of the electrical power that is acceptable to the battery on a basis of a limiting value of the thermal power that is acceptable, the limiting value of the thermal power being stored in memory beforehand and used in the thermal model, and
   controlling the electrical power passing through the battery during charging or during discharging in order to keep the electrical power passing through the battery below the limiting value.

4. The method according to claim 1, comprising estimating the thermal power, at each point in time, also taking into account a state of health of the battery.

5. The method according to claim 1, comprising establishing the thermal model of the battery.

6. The method according to claim 1, comprising verifying the thermal model of the battery, by comparing the thermal power measured at a plurality of times during charging or during discharging with the thermal power estimated at said times using the thermal model of the battery, not corrected for the time constant of the battery.

7. A device for managing thermal behavior of a battery, comprising:
   a module configured to determine a time constant of the battery, the time constant corresponding to a time interval existing between a moment at which thermal energy is given off by the battery and a moment at which a corresponding rate of heat flow is measured at a surface of the battery, the module being configured to measure electrical power passing through the battery;
   a module configured to execute a thermal model of the battery, wherein the model is configured to estimate, at each point in time, a thermal power generated by the battery depending on the measured electrical power passing through the battery, the thermal model comprising a charging law and a discharging law, each law being based on a state of charge of the battery and on a temperature of the battery and incorporating the time constant of the battery, and
   a module configured to control the thermal power generated by the battery comprising determining the thermal power using the model and controlling the electrical power passing through the battery based upon the determined thermal power.

8. The device according to claim 7, comprising:
   a module configured to estimate the thermal power generated at each point in time by the battery depending on the electrical power delivered at each point in time by the battery during charging thereof or generated at each point in time by the battery during discharging thereof, the thermal power being determined using the thermal model, a module configured to compare the thermal power estimated at each point in time, or a variation in the estimated thermal power over time, during charging or during discharging, with a limiting value, and a module configured to control electrical power delivered to the battery during charging or generated by the battery during discharging in order to keep the estimated thermal power below the limiting value.

9. The device according to claim 7, comprising:

a module configured to determine at each point in time a limiting value of the electrical power that is acceptable to the battery on a basis of a limiting value of the thermal power that is acceptable, the limiting value of the thermal power being stored in memory beforehand and used in the thermal model, and a module configured to control the electrical power passing through the battery during charging or during discharging, the module being configured to keep the electrical power passing through the battery below the limiting value.

10. The device according to claim 8, wherein the module configured to estimate the thermal power is configured to estimate, at each point in time, taking into account a state of health of the battery.

11. The device according to claim 7, comprising a module configured to establish the thermal model of the battery.

12. The device according to claim 7, comprising a module configured to verify the thermal model of the battery and to compare thermal power measured at a plurality of times during charging or during discharging with the thermal power estimated at the times using the thermal model of the battery, not corrected for the time constant of the battery.

13. The method according to claim 1, wherein the controlling comprises:

determining limiting values for the electrical power passing through the battery during charging and discharging, respectively, determining a range between corresponding ones of the limiting values during charging and discharging, updating at a plurality of times, the limiting values, to produce a corresponding plurality of ranges, and maintaining the electrical power to be with the ranges.

* * * * *